Oct. 30, 1962 F. B. FIBRANZ 3,061,784

BIAS CONTROL CIRCUIT

Filed Dec. 22, 1958

INVENTOR.
Floyd B. Fibranz
BY Mueller & Aichele
Attys.

United States Patent Office 3,061,784

Patented Oct. 30, 1962

3,061,784

BIAS CONTROL CIRCUIT

Floyd B. Fibranz, Elmhurst, Ill., assignor to Motorola, Inc., Chicago, Ill., a corporation of Illinois Filed Dec. 22, 1958, Ser. No. 782,294
2 Claims. (Cl. 325—319)

Figure 1:
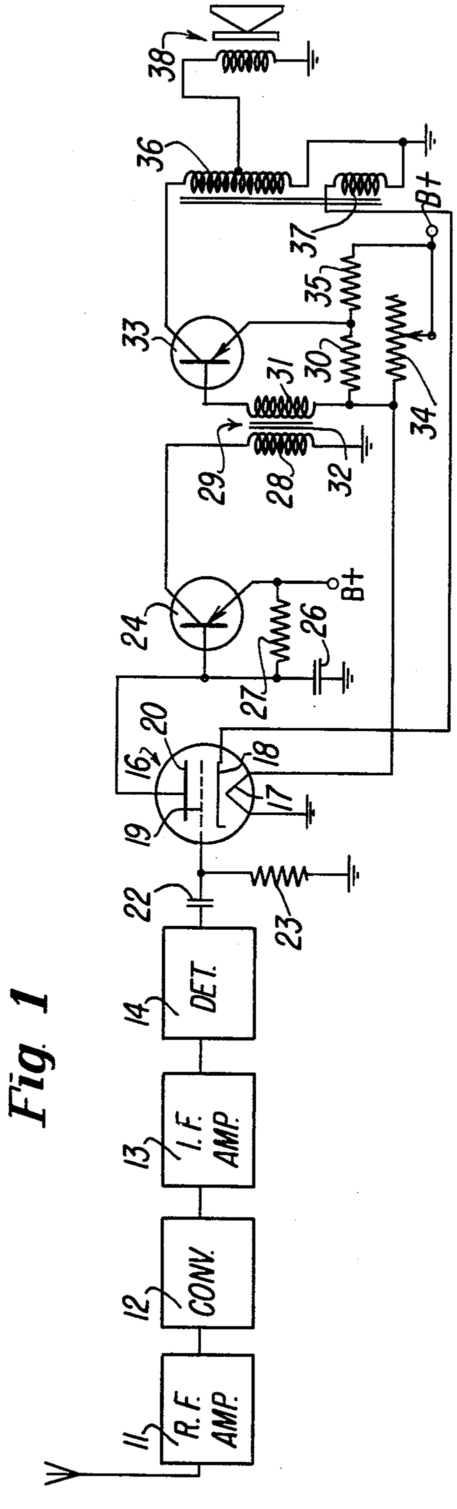

This invention relates to bias circuits for transistors and more particularly to means for controlling the bias voltage of a power transistor in a radio receiver which is powered by a variable voltage source such as an automobile electrical system.

Certain types of radio receivers, particularly auto radios, utilize both vacuum tubes and transistors. In such receivers a power transistor is used in the power amplifier stage and has its bias voltage supplied from the electrical system of the automobile. The bias voltage controls the conductance of the power transistor, which is also influenced by its temperature. A suitable voltage divider, usually made up of two resistors, is connected across the voltage supply to the receiver in order to minimize bias voltage changes on the power transistor resulting from the inevitable changes in voltage of the electrical system. However, this does not completely eliminate bias voltage changes and these may provide bias voltages outside the limits of the transistor so that distortion is produced. Also, as the bias voltage rises the conductance of the transistor is increased and this, in turn, causes more heat to be generated for dissipation. Although a heat sink is provided for the transistor to dissipate the heat therefrom, unless the dissipation is completely effective, the temperature of the semiconductor body making up the transistor will rise and the conductance of the unit is increased further.

In automobile radio receivers which must be operated over a wide range of ambient temperatures, effective heat dissipation is sometimes impaired by the fact that the heat sink in contact with the transistor may be at a temperature in excess of 100° F. Under such conditions an increase in operating voltage from the automobile electrical system will cause an increased bias voltage and may produce a so-called "run-away" effect causing the transistor to burn out and resulting in failure of the receiver.

It is possible to control the bias voltage of a power transistor under the aforementioned circumstances by the inclusion of a ballast tube in the aforementioned voltage divider. However, the manufacture of auto radio receivers is highly competitive from a cost standpoint and it is therefore desirable that bias voltage control be accomplished at a minimum of expense and without the inclusion of additional costly circuit elements.

It is an object of the present invention, therefore, to provide effective and at the same time inexpensive means of regulating the bias voltage on a transistor in a radio receiver powered by a variable voltage source.

It is a further object of the invention to provide simple and inexpensive means for preventing run-away action of a power transistor in a radio receiver or the like which may be subject to high ambient temperatures.

It is another object of the invention to provide means for improving the regulation of the bias voltage of a power transistor in an auto radio set which includes both tubes and transistors and at the same time simplifying the design of the set and rendering it less costly.

A feature of the invention is the use of a vacuum tube heater element as a ballast resistor for regulating the bias applied to a transistor used in the equipment with the vacuum tube.

Another feature of the invention is the connection of the filament of a vacuum tube as an element of a voltage divider for supplying bias to a power transistor in a radio receiver powered by an automobile electrical system so that the bias is stabilized in the presence of voltage variations in the system. The filaments of a pair of tubes of the receiver may be used to provide regulated bias for two transistors in a push-pull output stage.

Figure 2:
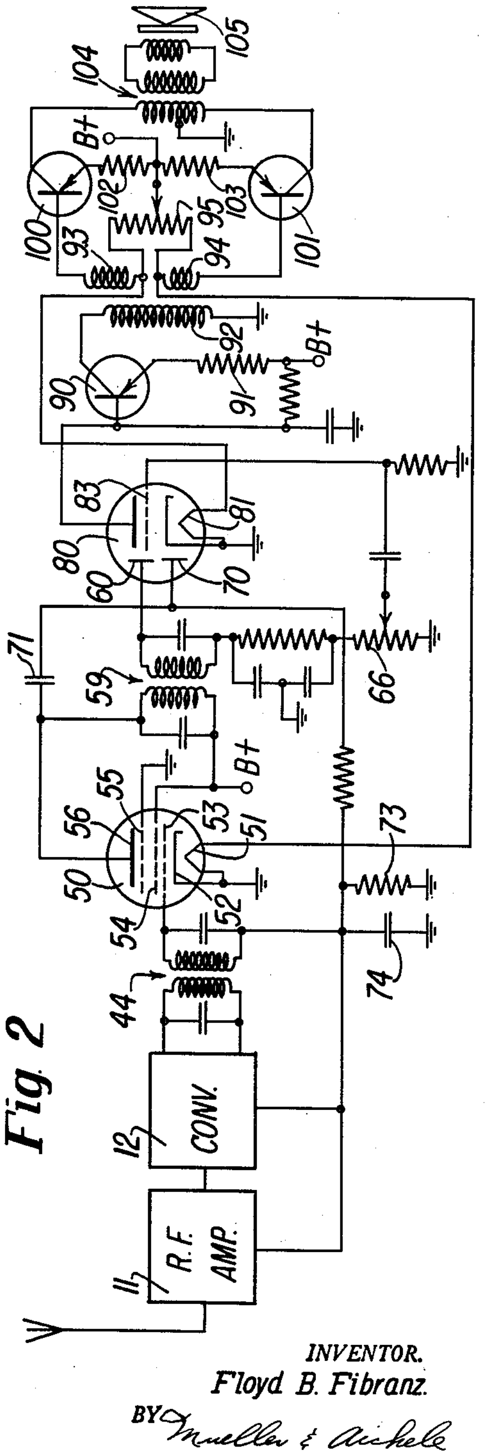

In the accompanying drawings:

FIG. 1 is a circuit diagram of an auto radio receiver embodying the present invention, with certain stages of the receiver shown in block diagram and others indicated schematically; and FIG. 2 is a circuit diagram illustrating another embodiment of the invention wherein the automobile radio receiver has a transistor push-pull type power amplifier stage.

In accordance with the present invention, an auto radio receiver of the so-called "hybrid" type includes at least one power transistor in the power amplifier stage cooperating with vacuum tubes in the other stages. The receiver is powered by the automobile electrical system whose output voltage may change substantially. The heater of a suitable one of these vacuum tubes is connected as an element of a voltage divider in the bias circuit of the power transistor. Since the heater of the vacuum tube varies in resistance in direct proportion to the amount of current therethrough, it acts like a ballast tube so that substantially constant bias voltage appears across the base and emitter of the power transistor despite variations in the voltage of the automobile electrical system. This arrangement has the advantage of eliminating one resistor of the voltage divider since the heater is already present in the receiver. Effective regulation is provided without adding a ballast element to the receiver, since the resistance of the heater varies with current and also serves this additional purpose. Regulation can be provided in a push-pull transistor stage by utilizing the heaters of two tubes of the receiver in the bias circuit.

As shown in FIG. 1 the receiver of the present invention includes a radio frequency amplifier stage 11, converter stage 12, intermediate frequency amplifier stage 13 and detecter stage 14 all of which are of conventional design and indicated in block diagram form in the accompanying drawings. A triode vacuum tube 16 in the audio frequency amplifier stage includes heater 17, cathode 18, grid 19, and plate 20. The grid 19 is connected to the detector stage 14 through coupling capacitor 22 and to ground through the grid leak resistor 23. The plate 20 is energized through resistor 27 connected to B+ and is bypassed by the capacitor 26.

A driver transistor 24 has its emitter connected to B+ supplied by the vehicle electrical system and has its base coupled to the plate 20. The collector of the driver transistor 24 is coupled to one end of the coil 28 which together with the coil 31 and magnetic core 32 make up the transformer 29.

The power amplifier stage of the receiver includes the power transistor 33 whose base is connected through coil 31 to the heater 17 of the vacuum tube 16 and to the variable resistor 34 to B+. The heater 17 and the potentiometer 34 form a voltage divider connected to the B+ source for providing the bias voltage to the base of transistor 33. Resistors 30 and 35 provide a bias voltage for the emitter of transistor 33. The collector of transistor 33 is coupled to one end of the coil 36 which forms an output auto-transformer which is connected to a loudspeaker indicated at 38. The transformer may include a feedback winding 37 connected to the cathode 18 of triode 16.

Because of variations in the output of the generator of the automobile due to motor speed, the B+ voltage may vary considerably as from 11 to 16 volts despite the presence of the conventional automobile voltage regulator. In prior art receivers, the voltage divider providing bias has been made up of a potentiometer and an ordinary resistor so that only a part of the change in supply voltage is reflected as the change in bias voltage. In accordance with the present invention, however, the inclusion of the heater 17 of tube 16 enables better regulation to be obtained. This is because of the filament varies in resistance with its temperature and hence with the amount of current through it. Thus, as the B+ supply voltage increases a greater proportion of the voltage appears across the cathode filament 17, while that appearing across the potentiometer 34 and hence across the base-emitter connection of transistor 33 remains proportionally more constant. The circuit shown enables one resistor that would otherwise be included in the voltage divider to be eliminated thus reducing overall cost and at the same time providing better regulation. Since the triode 16 must be included in the circuit in any event, this improvement is obtained with a concomitant overall cost reduction.

In a comercially constructed embodiment of the invention as shown in FIG. 1, components of the following values were utilized and provided successful operation of the circuit:

| | | |
|---|---|---|
| Transistor 33 | | 2N176 |
| Resistor 30 | ohms | 5.6 |
| Resistor 34 | do | 15 |
| Resistor 35 | do | .68 |
| Vacuum Tube 16 | | 12AE6A |

The above values are listed solely for the purpose of illustrating a practical construction and are not intended to limit the invention in any way.

Referring now to FIG. 2, there is shown a similar receiver having a push-pull type power amplifier circuit embodying the invention. The radio frequency amplifier stage 11 and converter stage 12 are of standard design and are indicated in block diagram form in the accompanying drawings. The converter 12 is coupled to an intermediate frequency amplifier stage through tuned coupling circuit 44. The intermediate frequency amplifier stage includes a pentode vacuum tube 50, a heater 51, cathode 52, control grid 53, screen grid 54, suppressor grid 55 and plate 56. The tube elements are connected in a standard amplifier circuit. One side of heater 51 is connected to ground as will be further described. Amplified intermediate frequency signals are coupled through tuned coupling circuit 59 to a diode type detector stage which may include detector plate 60 of vacuum tube 80. Rectified amplitude modulated intermediate frequency signals are fed from plate 60 thorugh a filter network to provide audio signals across resistor 66.

Also shown in FIG. 2 is a diode-type automatic volume control circuit including plate 70 of tube 80 to which signals are applied through coupling capacitor 71. The average rectified direct current voltage, developed across resistor 73 and capacitor 74 is used to vary the bias on the radio frequency converter and intermediate frequency amplifier tubes. Since this negative voltage is proportional to the average amplitude of the signal, gain is reduced as the signal strength becomes greater. The automatic volume control circuit employed here is standard and was omitted from FIG. 1 of the drawing so that a simple triode vacuum tube could be shown therein.

The audio signal is applied to the grid 83 of the audio frequency amplifier section of tube 80. The output of this section is applied to the base of driver transistor 90, which has its emitter connected through bias resistor 91 to B+ supplied by the vehicle electrical system. The output of driver transistor 90 is developed across primary winding 92 connected between the collector thereof and ground.

A power amplifier circuit includes a pair of transistors 100 and 101 which are connected in a push-pull circuit to drive the loudspeaker 105. Input signals are coupled from the primary winding 92 to the secondary winding 93, which is connected from the base of transistor 100 and through balance potentiometer 95 and resistor 102 to the emitter of transistor 100 to apply driving signals between the base and emitter. Similarly, secondary winding 94 is connected to the base of transistor 101 and, through potentiometer 95 and resistor 103 to the emitter of transistor 101. The interconnection of emitter resistors 102 and 103 and the movable arm of potentiometer 95 is connected to a positive potential source which may be provided by the automobile electrical system, here again designated as B+. The collectors of transistors 100 and 101 are respectively connected to each end of the primary of output transformer 104 which has a grounded center tap. The secondary of this output transformer is coupled to the loudspeaker 105. Accordingly, the push-pull output provided in the collector circuits of the transistors is used to drive the loudspeaker 105.

In accordance with the invention, the ungrounded side of the heater 81 of tube 80 is connected between secondary winding 93 and balance potentiometer 95. Thus, the heater 81 and one side of potentiometer 95 form a voltage divider network connected across the potential source wherein the potential appearing across the side of potentiometer 95 connected to heater 81 is applied between the base and emitter of transistor 100 as a base bias therefor. In the same manner the ungrounded side of heater 51 of tube 50 is connected between secondary winding 94 and balance potentiometer 95. The heater 51 and the side of the potentiometer 95 connected thereto provide a voltage divider network for biasing the base of transistor 101. The heater elements selected for use in the voltage divider biasing networks may be in any of the vacuum tubes of the preceding stages of the receiver, but the heaters selected must have substantially equal values of resistance and substantially equal positive temperature coefficients of resistance. Substantially matched operation of the two biasing networks required for push-pull operation of the audio amplifier will then be obtained with a balancing adjustment permitted by the balance potentiometer 95.

In accordance with the present invention, the replacement of an ordinary resistor of a voltage divider network by the heater element of a vacuum tube already in the receiver enables better regulation to be obtained while eliminating this resistor. In the push-pull embodiment of the invention, this will mean a saving of two resistors. As in the voltage divider circuit described in FIG. 1, better stabilization of the bias voltage is achieved because the filament temperature of the heater will vary in direct proportion to the current through it. A voltage increase in the B+ supply will draw an equal and increased amount of current through heaters 51 and 81. Since the filaments of these heaters have positive temperature coefficients of resistance their resistance will increase with the heating effect created by the current increase. The temperature coefficient of the ordinary resistor used in the balance potentiometer 95 is less than that of the heaters 51 and 81. Thus, the voltage drop across the heater portions of the respective voltage divider networks will increase in a greater proportion than that appearing across the respective sides of balance potentiometer 95. Hence, the voltage variations of the automobile electrical system will be reflected in greater degree in the voltage appearing across the heater portions of the voltage dividers, thereby reducing the variation in bias voltage developed in the balance potentiometer portions of the voltage dividers. Thus, as in FIG. 1, the embodiment of the present invention shown in FIG. 2 provides a system whereby the base to emitter bias voltage of each transistor in a push-pull audio power amplifier stage may be made more independent of the fluctuations in the automobile electrical system voltage.

Effective regulation of the bias voltage between base and emitter of a transistor helps prevent so-called run away action which is particularly liable to take place when the receiver is operated under conditions of high temperature. Under such conditions the heat sinks in which the power transistor are mounted are less effective in dissipating heat generated during the operation of the transistors so that there may be a tendency for their internal temperature to rise thus increasing conduction therethrough and correspondingly increasing the amount of heat which must be dissipated.

Although the ballast resistance element in the embodiments illustrated is an indirect cathode heater, it will be understood that a filamentary cathode may also be used for the same purpose. It is necessary, of course, that the ballast resistance element have a positive temperature coefficient of resistance.

The present invention provides, therefore, means for substantially improving the regulation of the bias voltage on a power transistor in an auto radio receiver while at the same time reducing its overall cost. This action is particularly important in auto radio receivers subjected to extreme voltage changes in their power supply in that the stabilization of the bias voltage results in lower distortion. Also, one of the causes of run-away action of the power transistor is minimized. Improvement in overall receiver performance and reliability is thus achieved.

I claim as my invention:

1. In electronic apparatus energized from an electrical supply which may vary in voltage and including first and second vacuum tubes each having heater means of substantially equal resistance and with substantially the same positive temperature coefficients of resistance, and which apparatus also includes first and second transistors each having input and common electrodes, a bias supply system including in combination; potentiometer means having a resistance element with a less positive temperature coefficient of resistance than that of said heater means and having a variable tap engaging said resistance element to define first and second portions, means connecting one side of said heater means of said first vacuum tube in series with said first portion of said potentiometer, means connecting one side of said heater means of said second vacuum tube in series with said second portion of said potentiometer, means connecting the other sides of said heater means and the variable tap of said potentiometer across said electrical supply, means connecting said input and common electrodes of said first transistor across said first portion of said potentiometer, means connecting said input and common electrode of said second transistor across said second portion of said potentiometer, with the voltage variations in the electrical supply being reflected in greater proportion across the heater means of said bias supply system to provide a stabilized voltage across the input and common electrodes of said transistors.

2. A radio receiver adapted to be energized directly from a vehicle electrical system having a voltage source subject to fluctuations ranging in the order of 11 to 16 volts, said radio receiver including in combination, a plurality of receiver stages, with at least one of said stages including a vacuum tube having heater means therein with a resistance which increases directly with tendency for current increase therethrough, and with at least one other of said stages having a transistor therein with base, emitter, and collector electrodes, load impedance means connected to said collector electrode, means for connecting said emitter electrode and said load impedance means across the voltage source to establish a signal current path, biasing resistor means connected between said base and emitter electrodes, means connecting said heater means between said base electrode and the voltage source to form a voltage divider with said biasing resistor means so that said heater means and said resistor means conduct a common current in parallel with said signal current path through said transistor, said biasing resistor means having a relatively stable resistance with voltage variations so that the voltage fluctuations are reflected in greater proportion across said heater means thereby regulating the emitter to base bias of said transistor during the voltage fluctuations.

References Cited in the file of this patent

UNITED STATES PATENTS

| | | |
|---|---|---|
| 2,810,071 | Race | Oct. 15, 1957 |
| 2,831,114 | Van Overbeek | Apr. 15, 1958 |
| 2,929,926 | Fibranz | Mar. 22, 1960 |
| 2,970,213 | Dukat | Jan. 31, 1961 |

OTHER REFERENCES

Article, "Tube Transistor Radio," pages 48–49 of Electronic Design for July 1955.

Article, "The Thunderbird—a New transistorized Portable Radio," pages 35–37 of The Sylvania Technologist, vol. 10, No. 2, for April 1957, from Library.